Figure 1:
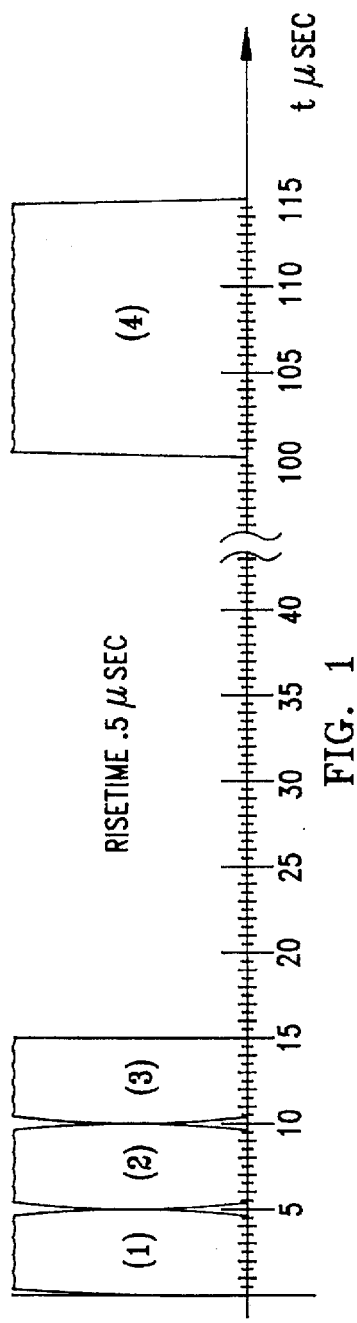

United States Patent [19]

Johannessen

[11] Patent Number: 5,734,544
[45] Date of Patent: Mar. 31, 1998

[54] SOLID-STATE PULSE GENERATING APPARATUS AND METHOD PARTICULARLY ADAPTED FOR ION IMPLANTATION

[75] Inventor: Paul R. Johannessen, Lexington, Mass.

[73] Assignee: Megapulse, Inc., Bedford, Mass.

[21] Appl. No.: 677,099

[22] Filed: Jul. 9, 1996

[51] Int. Cl.⁶ ............................................. H01H 47/26
[52] U.S. Cl. .................. 361/205; 361/153; 307/106; 307/107
[58] Field of Search ..................... 361/143, 153, 361/204–206; 363/71, 90–93; 427/523–531; 307/106–107

[56] References Cited

U.S. PATENT DOCUMENTS

| | | | |
|---|---|---|---|
| 2,786,132 | 3/1957 | Rines | 342/367 |
| 3,786,334 | 1/1974 | Johannessen | 363/71 |
| 3,889,263 | 6/1975 | Johannessen | 342/388 |
| 4,001,598 | 1/1977 | Johannessen | 307/106 |
| 4,191,922 | 3/1980 | Harris et al. | 324/225 |
| 4,230,955 | 10/1980 | Johannessen | 361/204 |
| 4,674,022 | 6/1987 | Ver Planck | 363/57 |
| 4,684,820 | 8/1987 | Valencia | 307/106 |
| 4,764,394 | 8/1988 | Conrad | 427/525 |

*Primary Examiner*—Jeffrey A. Gaffin
*Assistant Examiner*—Michael J. Sherry
*Attorney, Agent, or Firm*—Rines and Rines

[57] ABSTRACT

A relatively wide d.c. pulse generating system providing rise times normally attainable only with much narrower pulse width generation, comprising a plurality of sequentially operated groups of d.c. pulse generating modules achieving the combination of zero current SCR-switching and rapid magnetic switching and providing very high reliability and efficiency, and with the feature of continuously variable pulse width control and overall amplitude contouring, as for controlling applications such as plasma ion implantation where non-uniform contours of ion depth penetration normally would otherwise obtain.

11 Claims, 2 Drawing Sheets

/ 5,734,544 /

SOLID-STATE PULSE GENERATING APPARATUS AND METHOD PARTICULARLY ADAPTED FOR ION IMPLANTATION

The present invention relates to high power pulse generation, being more particularly concerned with the generation of relatively wide d.c. pulses with solid-state circuitry that, none-the-less, have the extremely fast rise time attainable with the generation of much narrower pulses.

BACKGROUND

The generation by solid-state systems of narrow pulses of the order of about one or a few microseconds with fractional microsecond rise times has earlier been accomplished and widely used in many applications including radar, pulse communications, stroboscopy, flash photography and other uses. The combining, overlapping and sequencing operation of such pulses to generate high power radio-frequency pulses as for Loran-C navigation and other purposes has been successfully implemented and widely used, (as, for example, in U.S. Pat. Nos. 3,786,334; 3,889,263; and 4,001,598 to Paul R. Johanessen, and earlier U.S. Pat. No. 2,786,132 to Robert H. Rines, of common assignee herewith.

There are special applications and problems, however, where such techniques are not directly transferable or useable to achieve required d.c. pulses of the order of say, 10–15 microseconds width (or more), that still require the very fast rise time (of the order of 0.5 microseconds) that have only heretofore been achieved in one or a few microsecond pulsing circuits, and, moreover, have the added function of amplitude and pulse width variability during operation.

Among such special applications is, for example, the solid-state circuit generation of about 10–15 microsecond d.c. pulses having about 0.5 microsecond rise and fall times, and pulse repetition rates of the order of about five to ten thousand per second, with an rms power of up to 1 megawatt or so, for such uses as a plasma source for ion implantation (PSII) on various surfaces and substrates, or the like.

Such plasma source ion implantation processes alter the surface composition of many different materials. These processes are somewhat similar to the concept of electroplating, but the working fluid is an ionized gas, as described, for example, in U.S. Pat. No. 4,764,394. Ion implantation, however, requires a voltage that may be 100 kv or more, as compared with the small voltage required for electroplating. All surfaces, moreover, may be simultaneously implanted, with the implant forming a covalent bond with the surface or base material—the covalent bond insuring that the coating is well adhered to the surface. Such bonded coatings may improve surface hardness and/or reduce friction and wear, and corrosion resistance may be achieved. The process may also be athermal, presenting alteration of the material temper, stress relief or dimensional change—factors of important implication for many different types of industrial manufacture. Desired results and processes may depend upon the particular "reapes," but may, for example, include diamond films, nitriding and carbiding, among other applications.

In such processes, moreover, the plasma has deleterious effects, causing arcing, spitting and sputtering, putting additional stringent demands upon the pulse generating modulator not found in other pulsing applications.

It is to the solution of these difficulties in providing suitable solid state pulsing circuits and techniques that can meet these requirements and obviate the plasma ion implantation problems, or similar problems in other applications, that the present invention is primarily directed.

OBJECTS OF INVENTION

It is a primary object of the invention, accordingly, to provide a new and improved solid-state pulse generating apparatus and method that are particularly, though not exclusively, adapted to produce the relatively wide d.c. pulses with very short rise times and high voltages and often amplitude envelope shaping required for plasma ion implantation and similar processes, and that, in addition, are tolerant to the arcing and other insults inherent in the above-mentioned and other deleterious effects of such plasma ion implantation procedures.

Other and further objects will be explained hereinafter and are more particularly delineated in the appended claims.

SUMMARY

In summary, however, from one of its viewpoints, the invention embraces apparatus for generating relatively wide d.c. pulses having the fast rise time of much narrower d.c. pulses and having, in combination, a plurality of sequentially operated d.c. pulse generating modules each having SCR-controlled capacitor means initially charged from a d.c. power supply through a first inductor and a first SCR switch, and then discharged through a further inductor, a further SCR switch and a saturable magnetic switch upon turn-on of the further SCR switch; the magnetic switch, in turn, being connected to a pulse forming network and a load, the network discharging into the load upon the closing of the magnetic switch; and a square-loop-core inductor connected across the load and of unsaturated high impedance during the discharge of the network into the load and of saturated low impedance upon the turning on of the magnetic switch, thereby providing the combination of zero current SCR switching and rapid magnetic switching; and, where needed, means for shaping the amplitude envelope of the resulting pulses to correspond substantially to a predetermined contour.

Preferred and best mode designs and operational techniques including for overall pulse shaping, where desired, will be hereinafter described in detail.

DRAWINGS

Figure 2:
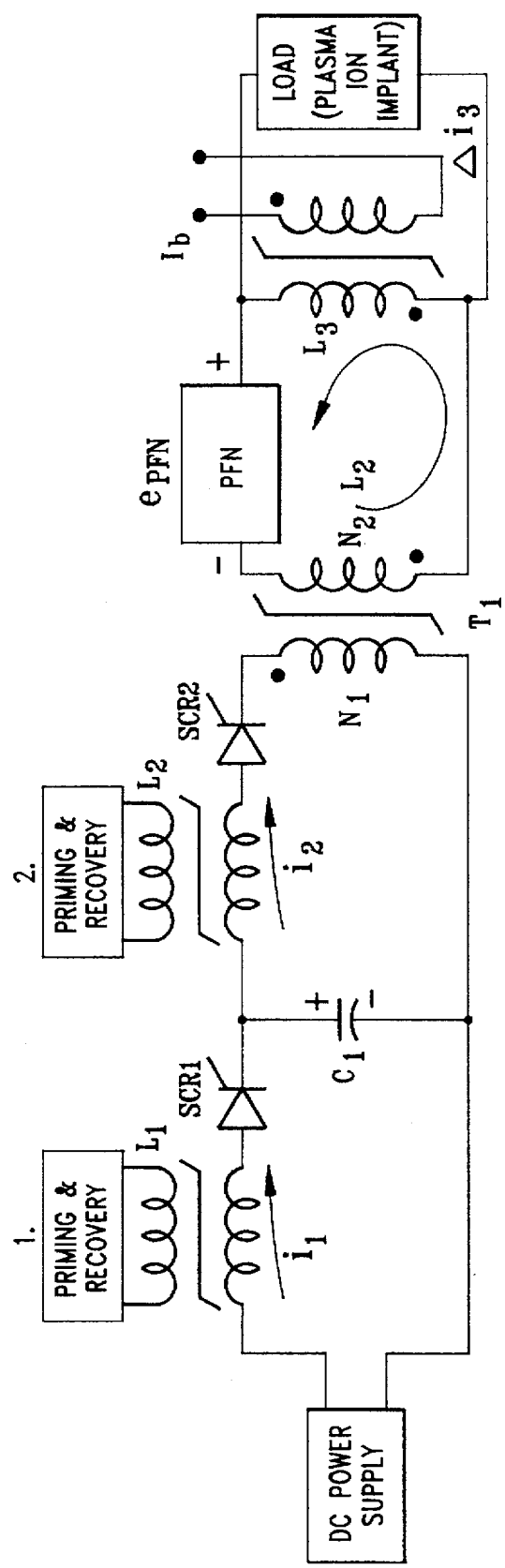
Figure 3:
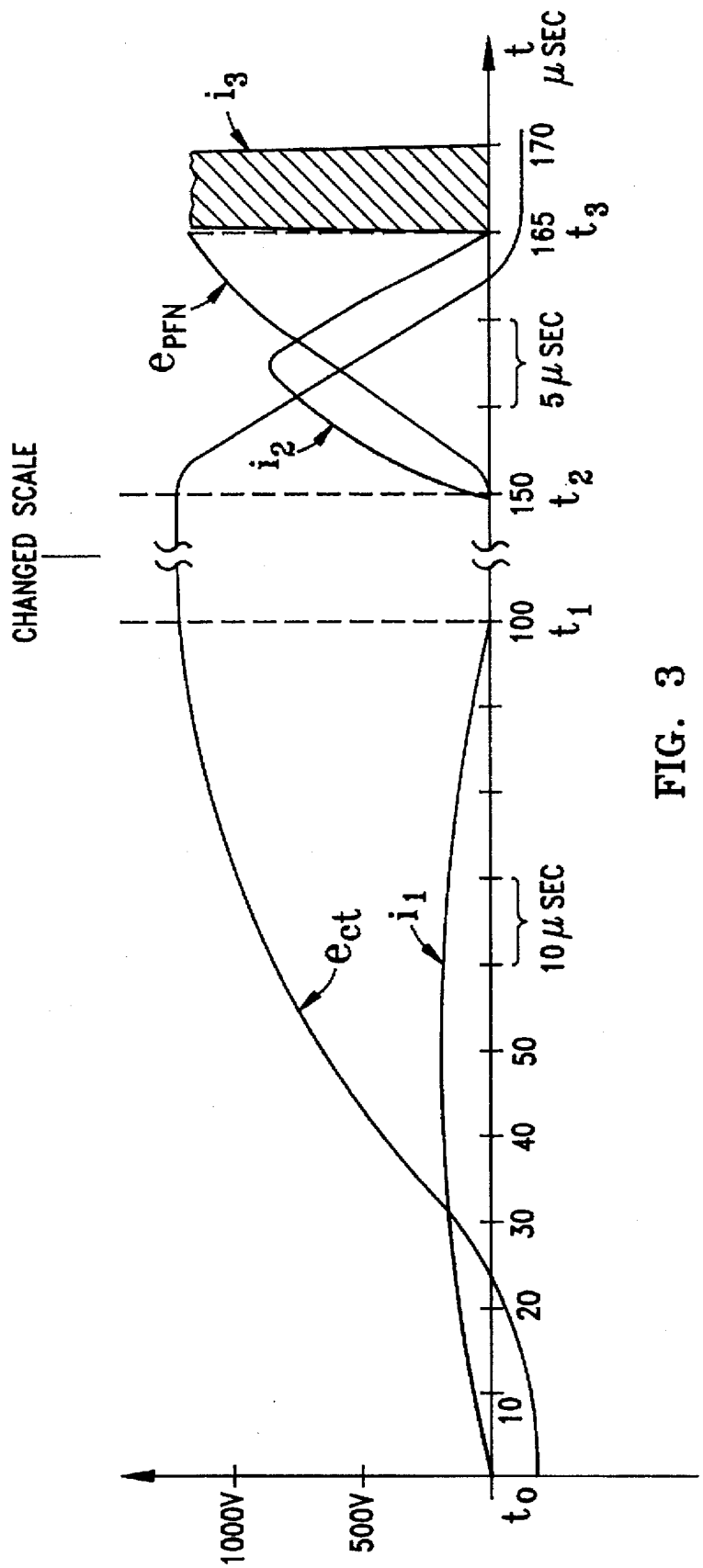

The invention will now be described in connection with the accompanying drawing, FIG. 1 of which is a wave-form diagram illustrating the development of the d.c. pulses of the invention;

FIG. 2 is a combined block and schematic circuit diagram of the preferred type of circuit for the purposes of the invention; and FIG. 3 are graphs of the various voltages and currents generated in the circuit of FIG. 2 as a function of time.

PREFERRED EMBODIMENT

Underlying the present invention, for the purposes above-described, is a novel combination of pulse generator modules, as of the before-mentioned Loran-C type generators of some of the before-cited patents, appropriately modified and operating with zero current switching for SCR or similar solid-state switching devices, together with a fast magnetic switch, providing very high reliability and efficiency with capability for continuous pulse width variation.

To illustrate the principles of the invention, the same will be described in connection with the before-discovered plasma ion implementation application, it being understood that illustrative circuit parameter the values are exemplary only.

Through the sequential combination of, say, five microsecond d.c. rectangular pulses (1), (2) and (3), FIG. 1, each having steep rise (and fall) times of the order of, say, half a microsecond or so, a much wider d.c. pulse (4) is attained—in this case, of fifteen microseconds width, but having the same half microsecond or so rise time of the narrower pulses. This is achieved, in accordance with the invention, by convening say, five microsecond wide generated sinusoidal pulses through use of a pulse forming network into corresponding five microsecond d.c. rectangular pulses as later explained, with, for example, three pulse generating modules (1), (2), (3), FIG. 2, combined sequentially for the performance shown in FIG. 1. As further later detailed, the third pulse generating module embodies a magnetic switch across the output load, providing the capability to vary the pulse width continuously—say from 10 to 15 microseconds.

Again for illustrative purposes, consider the following specifications:

| | |
|---|---|
| Rise Time: | .5 usec |
| Ripple: | 3 to 6% |
| Pulse Rep. Rate: | 5 to 10 thousand per sec |
| Peak Voltage: | 20 to 100 kV |
| Current: | 20 to 50 amps |
| Pulse Width: | 10–15 usec |

From these specifications, a peak pulse energy of: 75 Joules is required:

$$U_{peak}=V_{peak} \times I_{peak} \times T_{max}=100,000 \times 50 \times 15 \times 10^{-6}=75 \text{ Joules}$$

Maximum output peak power is:

$$(P_{out})=V_{peak} \times I_{peak}=5 \text{ Million watts}$$

Average output power is:

$$(P_{out})_{AV}=75 \times 10,000=750,000 \text{ watts}$$

If an efficiency of 75% is postulated, then the required input power is:

$$P_{in}=\frac{750,000}{75}=1 \text{ Million watts}$$

Present-day solid-state pulse generators used in the Loran-C transmitter of Megapulse, Inc., the assignee of the present invention, are described in "Current Developments in Loran-C, R. L. Frank, Proceedings of the IEEE, Vol. 71, October, 1983 and "Loran-C Solid State Transmitter Operation", Wild Goose Association International Loran Radionavigation Forum Preliminary Proceedings, Aug. 24–27, 1992. These are modular in construction, with later-described soft failure characteristics, and deliver 9 joules per pulse to the load, operating at a pulse repetition rate of 1000 pps. To obtain a pulse energy of 75 joules, nine such pulse generators are required to form each pulse. To obtain the 10,000 pps of the illustrative specification, ten groups of 9 pulse generating modules are needed, triggered sequentially. Thus, a total of 90 modules is required. The combinations of output voltages and currents that can be obtained with 90 or less number of modules are shown in Table 1.

TABLE 1

Output Voltages and Currents

| Pulse Width (μsec) | No. of PGM's | Connections | Output Voltage | Output Current |
|---|---|---|---|---|
| 10–15 | 90 | 3 seq. 3 par | 36 kV | 150 amps |
| 10–15 | 90 | 3 seq. 3 ser | 108 kV | 50 amps |
| 10 | 40 | 2 seq. 2 ser | 72 kV | 75 amps |
| 10–15 | 60 | 35 seq. 2 ser | 72 kV | 75 amps |
| 10 | 60 | 2 seq. 3 par | 36 kV | 150 amps |
| 10 | 60 | 2 seq. 3 ser | 108 kV | 50 amps |

A schematic circuit diagram of the preferred modified pulse generating module for these purposes is shown in FIG. 2, and the operational voltages and current waveforms are shown in FIG. 3.

A capacitor $C_1$, is charged from a DC Power Supply, so-labeled, through an inductor $L_1$ and thyristor $SCR_1$ during the time-interval $t_0-t_1$, FIG. 3. In the time interval $t_1-t_2$, $SCR_1$ recovers. At time $t_2$ the second thyristor $SCR_2$, in series with inductor $L_2$, is turned on. The energy on $C_1$ is transferred through transformer $T_1$ (primary $N_1$ and secondary $N_2$) to a Pulse Forming Netsyork (PFN) in the time interval $t_2-t_3$.

The transformer $T_1$ is the final switching element, being designed to saturate at time $t_3$ or slightly later, as shown in FIG. 3. When this occurs, the transformer magnetizing impedance becomes very low (closing magnetic switch) and the Pulse Forming Network (PFN) is discharged into the load (LOAD) in the form of an almost rectangular d.c. pulse, FIG. 1.

During the PFN discharge time-interval, the inductor $L_3$ across the LOAD is in the unsaturated high impedance state. Thus, only a very small percentage of the discharge current, $i_3$, FIG. 3, flows through $L_3$, indicated as $\Delta I_3$ in FIG. 2.

This magnetic switch is used across the LOAD because it has no restriction on di/dt as is the case for thyristors. Furthermore, it is a nondestructive element in the most critical switching action. The turn-on of this switch is controlled by setting the flux level of the square-loop magnetic core material in $L_3$, with the output voltage driving the core into saturation, turning on the magnetic switch. The time it takes to saturate is a function of the flux level settings, thus providing a time-controlled magnetic switch capability, enabling varying of the pulse width continuously, say from 10 to 15 microseconds.

A circuit referred to as "Priming and Recovery" is preferably connected in series with each thyristor $SCR_1$ and $SCR_2$ through respective inductors $L_1$ and $L_2$, FIG. 2. The priming part of this circuit allows the thyristor junction to be fully turned on before the start of the main thyristor current, thereby greatly increasing the di/dt capability of the thyristor; and the recover part of this circuit prevents high thyristor reverse voltage during the reverse-recovery interval as described, for example, in assignee's U.S. Pat. Nos. 4,230, 955; 4,191,922 and 4,674,022.

During the pulse interval, the amplitude of the pulse can be changed in steps by assigning a different number of modules to each of the five microsecond time intervals. Since the ion plasma sheet has a finite thickness, the ions close to the target or substrate get less energy than those ions farther away from the target. Thus, the depth of processing penetration of the ions and the profile contour of the depth penetration over the substrate are not uniform. By varying the overall pulse amplitude to shape the envelope to follow or correspond substantially to such process depth penetration profile or contour, control of the depth of the ion implantation processing may be obtained.

Clearly the invention is also useful, as before explained, for other processing applications and further modifications will occur to those skilled in this art, such being considered to fall within the spirit and scope of the invention as defined in the appended claims.

What is claimed is:

1. Apparatus for generating relatively wide d.c. pulses having the fast rise time of much narrower d.c. pulses and having, in combination, a plurality of sequentially operated groups of d.c. pulse generating modules each having SCR-controlled capacitor means initially charged from a d.c. power supply through a first inductor and a first SCR switch, and then discharged through a further inductor, a further SCR switch and ultimately a saturable magnetic switch upon turn-on of the further SCR switch; the magnetic switch, in turn, being connected to a pulse forming network and a load, the network discharging into the load upon the closing of the magnetic switch; and a square-loop-core inductor connected across the load and of unsaturated high impedance during the discharge of the network into the load and of saturated low impedance upon the turning on of the magnetic switch, thereby providing the combination of zero current SCR switching and rapid magnetic switching.

2. Apparatus as claimed in claim 1 and in which means is provided for varying the flux level of the square-loop-core inductor to control the time it takes for saturation thereof and thereby varying the output pulse width.

3. Apparatus as claimed in claim 2 and in which groups of said pulse generating modules are connected together and sequentially operated as for high pulse repetition control of plasma ion implantation loads and the like.

4. Apparatus as claimed in claim 1 and in which the pulse amplitude produced by successive modules is varied to shape the overall pulse amplitude to a predetermined contour.

5. Apparatus as claimed in claim 1 and in which each of the groups of pulse generating module units comprises a number of sequentially operated d.c. pulse generator modules.

6. Apparatus as claimed in claim 5 and in which the number of modules is made different for successive groups in order to produce a predetermined shape of overall amplitude profile of the resultant wide d.c. pulses.

7. Apparatus as claimed in claim 6 and in which said predetermined shape corresponds to a processing contour desired for said load.

8. Apparatus as claimed in claim 7 and in which said load comprises a plasma ion implantation system in which the depth of penetration of ions follows a non-uniform contour, and said shape of pulse amplitude is adjusted to accommodate said contour and control the implantation.

9. Apparatus as claimed in claim 5 and in which the said rise time is of the order of about half a microsecond and the wide d.c. pulse is of the order of about fifteen microseconds, with at least three pulse generating modules combined sequentially, and with the third pulse generating module embodying said magnetic switch across the output load, providing capability to vary the pulse width continuously.

10. A method of generating relatively wide d.c. pulses having the fast rise and fall times of much narrower d.c. pulses, that comprises, sequentially operating a plurality of groups of d.c. pulse generating modules each having SCR-controlled switching and saturable magnetic switching for discharging a pulse-forming network into a load; operating said switching to produce the combination of zero current SCR switching and rapid magnetic switching; and varying the number of modules in the various group to control the overall output pulse amplitude shape.

11. A method as claimed in claim 10 and in which the load comprises a plasma ion implantation system wherein non-uniform contours of ion depth penetration normally occur, and the number of modules is made different for the different groups correspondingly to shape the overall pulse amplitude to accommodate for such contours and thereby control the implantation.

* * * * *